(12) United States Patent
Xiao et al.

(10) Patent No.: US 9,455,700 B1
(45) Date of Patent: Sep. 27, 2016

(54) TRANSMIT/RECEIVE MODULE INCLUDING GATE/DRAIN SWITCHING CONTROL

(71) Applicant: MACOM Technology Solutions Holdings, Inc., Lowell, MA (US)

(72) Inventors: Qun Xiao, Acton, MA (US); Chengxin Liu, Bedford, MA (US); Christopher D. Weigand, Andover, MA (US)

(73) Assignee: MACOM Technology Solutions Holdings, Inc., Lowell, MA (US)

( * ) Notice: Subject to any disclaimer, the term of this patent is extended or adjusted under 35 U.S.C. 154(b) by 0 days.

(21) Appl. No.: 14/477,186

(22) Filed: Sep. 4, 2014

(51) Int. Cl.
*H04B 1/44* (2006.01)
*H03K 17/16* (2006.01)
*H03K 3/012* (2006.01)
*H03F 1/02* (2006.01)

(52) U.S. Cl.
CPC .......... *H03K 17/161* (2013.01); *H03F 1/0205* (2013.01); *H03K 3/012* (2013.01); *H04B 1/44* (2013.01)

(58) Field of Classification Search
CPC .................................. H04B 1/48; G01S 7/03
USPC .................................. 455/83, 144, 91, 194.2
See application file for complete search history.

(56) References Cited

U.S. PATENT DOCUMENTS

| | | | | |
|---|---|---|---|---|
| 7,439,806 B2 * | 10/2008 | Dow | ...................... | H03F 1/0261 330/133 |
| 8,008,970 B1 * | 8/2011 | Homol | ...................... | H03F 3/72 330/296 |
| 8,330,530 B2 * | 12/2012 | Homol | ...................... | H03F 3/72 327/427 |
| 8,525,590 B2 * | 9/2013 | Joly | ...................... | H03F 1/0211 330/285 |
| 8,933,727 B1 * | 1/2015 | Liu | ...................... | G01S 7/03 326/82 |
| 9,148,144 B1 * | 9/2015 | Liu | ...................... | G01S 7/03 |
| 2003/0157911 A1 * | 8/2003 | Gerna | ...................... | H04B 1/48 455/144 |
| 2011/0298526 A1 * | 12/2011 | Homol | ...................... | H03F 3/72 327/437 |
| 2012/0161878 A1 * | 6/2012 | Joly | ...................... | H03F 1/0211 330/296 |

OTHER PUBLICATIONS

Mathan Krishnan Akilan, "Packaged chipsets for Next Generation X Band Phased Array Radar", 9th International Radar Symposium India—2013 (IRSI-13); Dec. 10-14, 2013, pp. 1-5.

* cited by examiner

*Primary Examiner* — April G Gonzales
(74) *Attorney, Agent, or Firm* — Christopher P. Maiorana, PC

(57) ABSTRACT

An integrated circuit includes a transmit/receive (T/R) circuit and a gate/drain bias control circuit. The transmit/receive (T/R) circuit may be configured to transmit and receive radio frequency (RF) signals. The gate/drain bias control circuit may be configured to enable or disable internal gate switching of one or more amplifiers of the transmit/receive (T/R) circuit in response to a first control signal. When the internal gate switching is disabled the one or more amplifiers of the transmit/receive (T/R) circuit are enabled and disabled solely by external drain switching.

20 Claims, 14 Drawing Sheets

TABLE 1

| INPUTS | | | | OUTPUTS | | | | | | | | | |
|---|---|---|---|---|---|---|---|---|---|---|---|---|---|
| SWEN1 | SWEN2 | EN | T/R | SW1A50 | SW1B50 | SW2A50 | SW2B50 | SW3A1 | SW3B1 | SW4A1 | SW4B1 | L1, L2 | P1, P2 |
| 0 | 0 | 0 | 0 | VSS | VOPT1 | VSS | VOPT2 | VEE | GND | VEE | GND | VEE | VEE |
| 0 | 0 | 0 | 1 | VOPT1 | VSS | VOPT2 | VSS | VEE | GND | VEE | GND | VEE | VEE |
| 0 | 0 | 1 | 0 | VSS | VOPT1 | VSS | VOPT2 | VEE | GND | VEE | GND | GND | VEE |
| 0 | 0 | 1 | 1 | VOPT1 | VSS | VOPT2 | VSS | VEE | GND | VEE | GND | VEE | GND |
| 0 | 1 | 0 | 0 | VSS | VOPT1 | VSS | VOPT2 | VEE | GND | VEE | GND | VEE | VEE |
| 0 | 1 | 0 | 1 | VOPT1 | VSS | VOPT2 | VSS | VEE | GND | GND | VEE | VEE | VEE |
| 0 | 1 | 1 | 0 | VSS | VOPT1 | VSS | VOPT2 | VEE | GND | VEE | GND | GND | VEE |
| 0 | 1 | 1 | 1 | VOPT1 | VSS | VOPT2 | VSS | VEE | GND | VEE | VEE | VEE | GND |
| 1 | 0 | 0 | 0 | VSS | VOPT1 | VSS | VOPT2 | VEE | GND | VEE | GND | VEE | VEE |
| 1 | 0 | 0 | 1 | VSS | VOPT1 | VOPT2 | VSS | GND | VEE | VEE | GND | VEE | VEE |
| 1 | 0 | 1 | 0 | VSS | VOPT1 | VSS | VOPT2 | VEE | GND | VEE | GND | GND | VEE |
| 1 | 0 | 1 | 1 | VSS | VOPT1 | VOPT2 | VSS | GND | VEE | VEE | GND | VEE | GND |
| 1 | 1 | 0 | 0 | VSS | VOPT1 | VSS | VOPT2 | VEE | GND | VEE | GND | VEE | VEE |
| 1 | 1 | 0 | 1 | VSS | VOPT1 | VSS | VOPT2 | GND | VEE | VEE | VEE | GND | VEE |
| 1 | 1 | 1 | 0 | VSS | VOPT1 | VSS | VOPT2 | VEE | GND | VEE | GND | VEE | VEE |
| 1 | 1 | 1 | 1 | VSS | VOPT1 | VSS | VOPT2 | GND | VEE | GND | VEE | GND | GND |

FIG. 12

TRANSMIT/RECEIVE MODULE INCLUDING GATE/DRAIN SWITCHING CONTROL

This application relates to U.S. Ser. No. 13/592,816, filed Aug. 23, 2012, and U.S. Ser. No. 14/167,079, filed Jan. 29, 2014, which are incorporated by reference in their entirety.

FIELD OF THE INVENTION

The present invention relates to radar systems generally and, more particularly, to a method and/or apparatus for implementing a transmit/receive (T/R) module including gate/drain switching control.

BACKGROUND OF THE INVENTION

Transmit/receive (T/R) modules are often used in radar arrays. Typical T/R modules can include power amplifier (PA) stages, low noise amplifier (LNA) stages, digital phase shifters, digital attenuators and T/R switches for interconnecting various components depending on whether the T/R module is in a transmit or a receive mode. Conventional T/R modules with internal drivers cannot be configured to use either gate or drain switching. Gate switching with an internal driver is simpler for end users, but has a switching speed slower than drain switching. Conventional T/R modules do not allow internal gate switching to be disabled in favor of drain switching.

It would be desirable to implement a transmit/receive (T/R) module that can drive the numerous switches, phase shifters and attenuators, enable and disable receive and transmit amplifiers to reduce power dissipation, and support both gate switching and drain switching.

SUMMARY OF THE INVENTION

The present invention concerns an integrated circuit including a transmit/receive (T/R) circuit and a gate/drain bias control circuit. The transmit/receive (T/R) circuit may be configured to transmit and receive radio frequency (RF) signals. The gate/drain bias control circuit may be configured to enable or disable internal gate switching of one or more amplifiers of the transmit/receive (T/R) circuit in response to a first control signal. When the internal gate switching is disabled the one or more amplifiers of the transmit/receive (T/R) circuit are enabled and disabled solely by external drain switching.

The objects, features and advantages of the present invention include providing a transmit/receive (T/R) module including gate/drain switching control that may (i) enable or disable internal gate switching of one or more internal amplifiers of a transmit/receive (T/R) circuit, (ii) enable external drain switching of the one or more internal amplifiers of the transmit/receive (T/R) circuit when the internal gate switching is disabled, (iii) provide separate controls to multiple amplifier stages to reduce potential feedback, (iv) handle enough current to drive PIN diode switches, (v) provide an idle state when switching between transmit and receive modes avoiding potential loop oscillation, (vi) control transmitter and receiver amplifiers based on operating mode, (vii) allow either gate or drain switching of transmitter and receiver amplifiers based on a single control signal, and/or (viii) be implemented as an integrated circuit or multi-chip module.

BRIEF DESCRIPTION OF THE DRAWINGS

These and other objects, features and advantages of the present invention will be apparent from the following detailed description and the appended claims and drawings in which:

FIG. 12 is a truth table illustrating example operation of a transmit/receive module driver of FIG. 8;

DETAILED DESCRIPTION OF THE PREFERRED EMBODIMENTS

Figure 1:
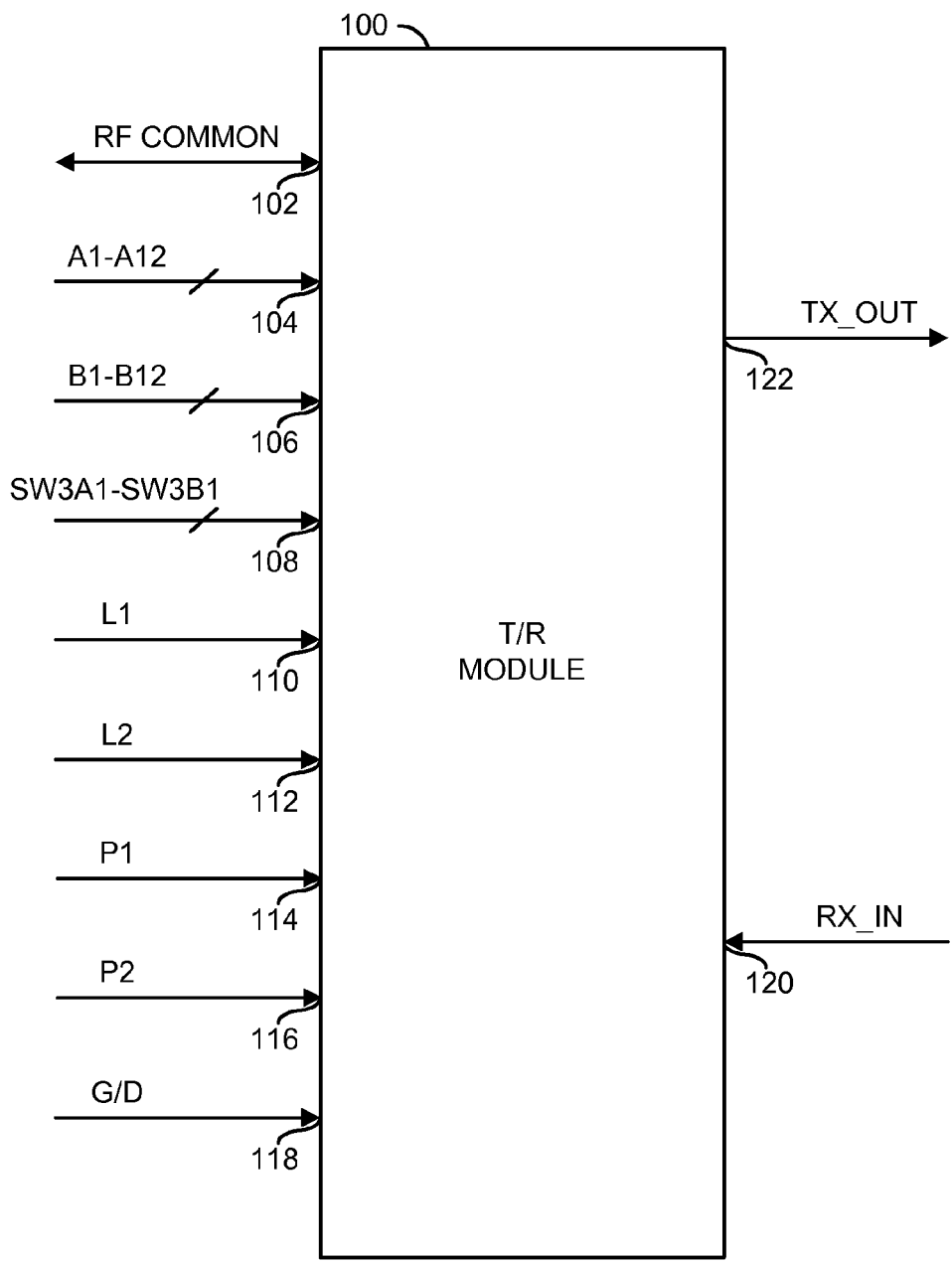
FIG. 1 is a diagram illustrating a transmit/receive module in accordance with an embodiment of the present invention.

Referring to FIG. 1, a diagram is shown illustrating a circuit 100 in accordance with an embodiment of the present invention. In one example, the circuit 100 may implement a transmit/receive (T/R) module. The circuit 100 may, in one example, be implemented as a gallium arsenide (GaAs) based transmit/receive (T/R) module. The circuit 100 may be implemented on a monolithic integrated circuit (IC). In various embodiments, the circuit 100 may be configured to provide varying amounts of digital attenuation and/or phase shift. The circuit 100 may also include functionality to switch between transmit and receive channels and to enable/disable low-noise amplifiers (LNAs) and/or power amplifiers (PAs).

In one example, the T/R module 100 may include an input/output 102, an input 104, an input 106, an input 108, an input 110, an input 112, an input 114, an input 116, an input 118, an input 120, and an output 122. In various embodiments, the input/output 102 may implement a radio frequency (RF) common port that may receive/present an RF signal. The input 104 may receive a first set of parallel inputs (e.g., A1-A12). The input 106 may receive a second set of parallel inputs (e.g., B1-B12). In one example, the inputs B1-B12 may be complementary to the inputs A1-A12. The input 108 may receive a pair of complementary signals (e.g., SW3A1 and SW3B1). The signals SW3A1 and SW3B1 may provide low-current (e.g., 1 mA) control inputs. The input 110 may receive a signal (e.g., L1). The input 112 may receive a signal (e.g., L2). The input 114 may receive a signal (e.g., P1). The input 116 may receive a signal (e.g., P2). The signals L1, L2, P1, and P2 may be used to enable/disable low-noise amplifiers (LNAs) and/or power amplifiers (PAs) using internal gate switching. The input 118 may receive a signal (e.g., G/D). The signal G/D may be configured to disable the internal gate switching control when external drain switching is used. The input 120 may receive an RF input signal (e.g., RX_IN). The output 122 may present an RF output signal (e.g., TX_OUT).

The signals A1-A12 and B1-B12 may be used to control digital attenuators and/or phase shifters. In one example, the signals SW3A1 and SW3B1 may be used to control one or more low-power (e.g., GaAs) T/R switches of a monolithic microwave integrated circuit (MMIC) implementing the circuit 100. The signals L1, L2, P1, and P2 may be used, in one example, to control amplifiers in the circuit 100 in the internal gate switching mode. For example, the signals L1 and L2 may be used to control separate stages of a low noise amplifier (LNA) section of a receiver chain. The signals P1 and P2 may be used to control separate stages of a power amplifier (PA) section of a transmit chain. In one example, the use of multiple control signals to control multiple amplifier stages may reduce the possibility of instability due to feedback between the amplifier stages.

Figure 2:
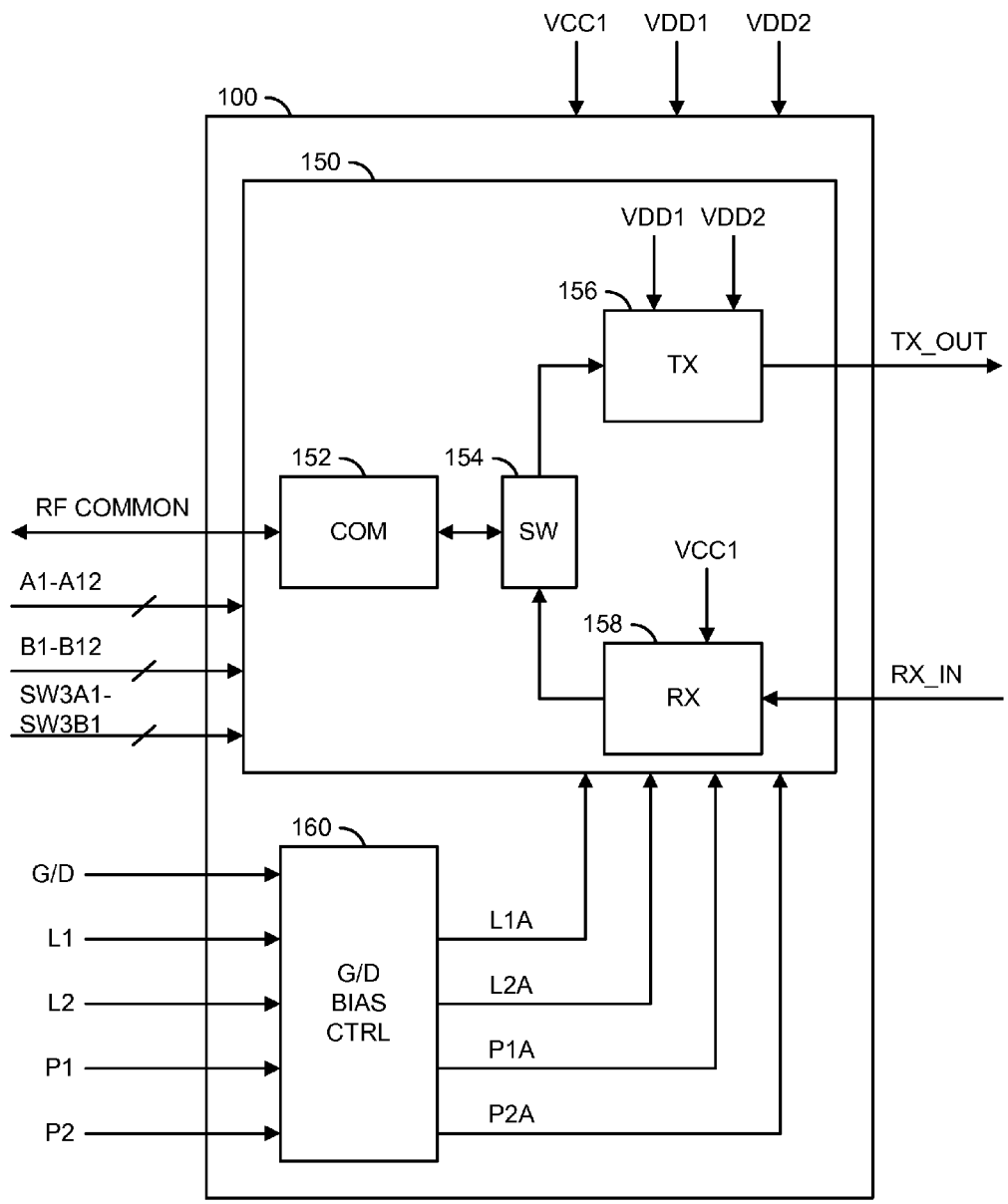
FIG. 2 is a diagram illustrating an example implementation of a transmit/receive (T/R) module in accordance with an example embodiment of the present invention.

Referring to FIG. 2, a diagram is shown illustrating an example implementation of a transmit/receive (T/R) module (or circuit) in accordance with an example embodiment of the present invention. In various embodiments, the circuit 100 comprises a transmit/receive (T/R) circuit 150 and a gain/drain (G/D) bias controller 160. The T/R circuit 150 may comprise a common leg RF circuit 152, a T/R switch 154, an RF transmit chain (or circuit) 156, and an RF receive chain (or circuit) 158. The RF COMMON port 102 may be connected to an input/output of the common leg RF circuit 152. The T/R switch 154 connects the common leg RF circuit 152 to the transmit chain 156 and the receive chain 158. The transmit chain 156 presents the RF output signal TX_OUT. The receive chain 158 receives the RF input signal RX_IN.

The T/R circuit 150 receives the signals A1-A12, B1-B12, SW3A1, SW3B1, and a number of control signals (e.g., L1A, L2A, P1A, and P2A). The signals A1-A12 and B1-B12 may be used to control (program) attenuation and/or phase shifting modules in the circuit 150. The signals SW3A1 and SW3B1 may be used to control the T/R switch 154. The signals L1A, L2A, P1A, and P2A may be used to control operation of one or more low-noise amplifiers (LNAs) and/or power amplifiers (PAs) in the T/R circuit 150. The circuit 150 may receive a number of supply voltages (e.g., VCC1, VDD1, VDD2, etc.) that may be used to power the one or more low-noise amplifiers (LNAs) and/or power amplifiers (PAs). In one example, the signals L1A, L2A, P1A, and P2A may be used to disable internal gate switching of the low-noise amplifiers (LNAs) and/or power amplifiers (PAs). When internal gate switching is disabled, the one or more low-noise amplifiers (LNAs) and/or power amplifiers (PAs) may be controlled using external drain switching of the supply voltages. For example, a first switched supply (e.g, VCC_SW) may be applied in place of VCC1 and a second switched supply (e.g., VDD_SW) may be applied in place of VDD1 and VDD2.

The gain/drain (G/D) bias controller 160 has a number of inputs that receive the signals L1, L2, P1, P2, and G/D. The gate/drain (G/D) bias controller 160 may be configured to generate the signals L1A, L2A, P1A, and P2A, which enable/disable the internal gate switching of the circuit 100 using the signals G/D, L1, L2, P1, and P2. In various embodiments, the G/D bias controller 160 configures the circuit 100 for internal gate switching when the signal G/D is in a first state (e.g., 0V) and for external drain switching when the signal G/D is in a second state (e.g., VEE). In various elements, when internal gate switching is enabled, the LNAs (receive amplifiers) and the PAs (transmit amplifiers) are enabled/disabled based upon the signals L1, L2, P1, and P2. When internal gate switching is disabled (external drain switching selected), external devices (e.g., one or more metal oxide semiconductor field effect transistors or MOSFETs) are used to supply the bias voltages to the LNAs and PAs, and the LNAs and PAs are enabled/disabled depending on whether respective MOSFETs are "ON" or "OFF".

Figure 3:
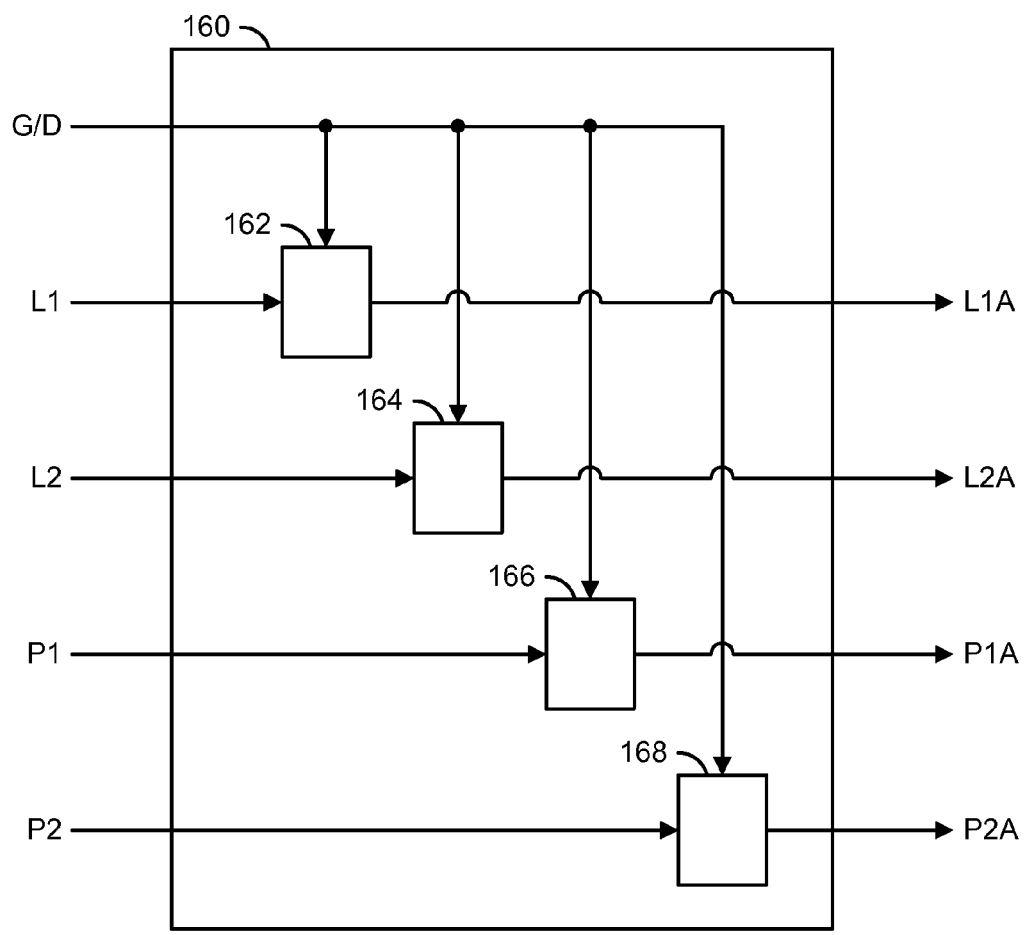
FIG. 3 is a diagram illustrating a gate/drain bias controller in accordance with an example embodiment of the present invention.

Referring to FIG. 3, a more detailed diagram is shown illustrating an implementation of a gate/drain bias controller 160 in accordance with an example embodiment of the present invention. In various embodiments, the gate/drain bias controller 160 may comprise a gate/drain bias circuit 162, a gate/drain bias circuit 164, a gate/drain bias circuit 166, and a gate/drain bias circuit 168. Each of the gate/drain bias circuits 162, 164, 166, and 168 may have a control input that receives the signal G/D, an input that receives a respective one of the signals L1, L2, P1, and P2, and an output that presents a respective one of the signals L1A, L2A, P1A, and P2A. The gate/drain bias circuits 162, 164, 166, and 168 are configured to generate the respective signals L1A, L2A, P1A, and P2A in response to the signal G/D and the respective signals L1, L2, P1, and P2. The gate/drain bias circuits 162, 164, 166, and 168 may be implemented with similar or different circuits to meet the design criteria for controlling particular amplifiers of the T/R circuit 150. In general, when internal gate switching is selected by the signal G/D (e.g., G/D set to VEE), the signals L1A, L2A, P1A, and P2A are set by the signals L1, L2, P1, and P2, respectively. When external drain switching is selected by the signal G/D (e.g., G/D set to 0V), the signals L1A, L2A, P1A, and P2A bias the amplifier control gates always ON to facilitate external drain switching.

Figure 4:
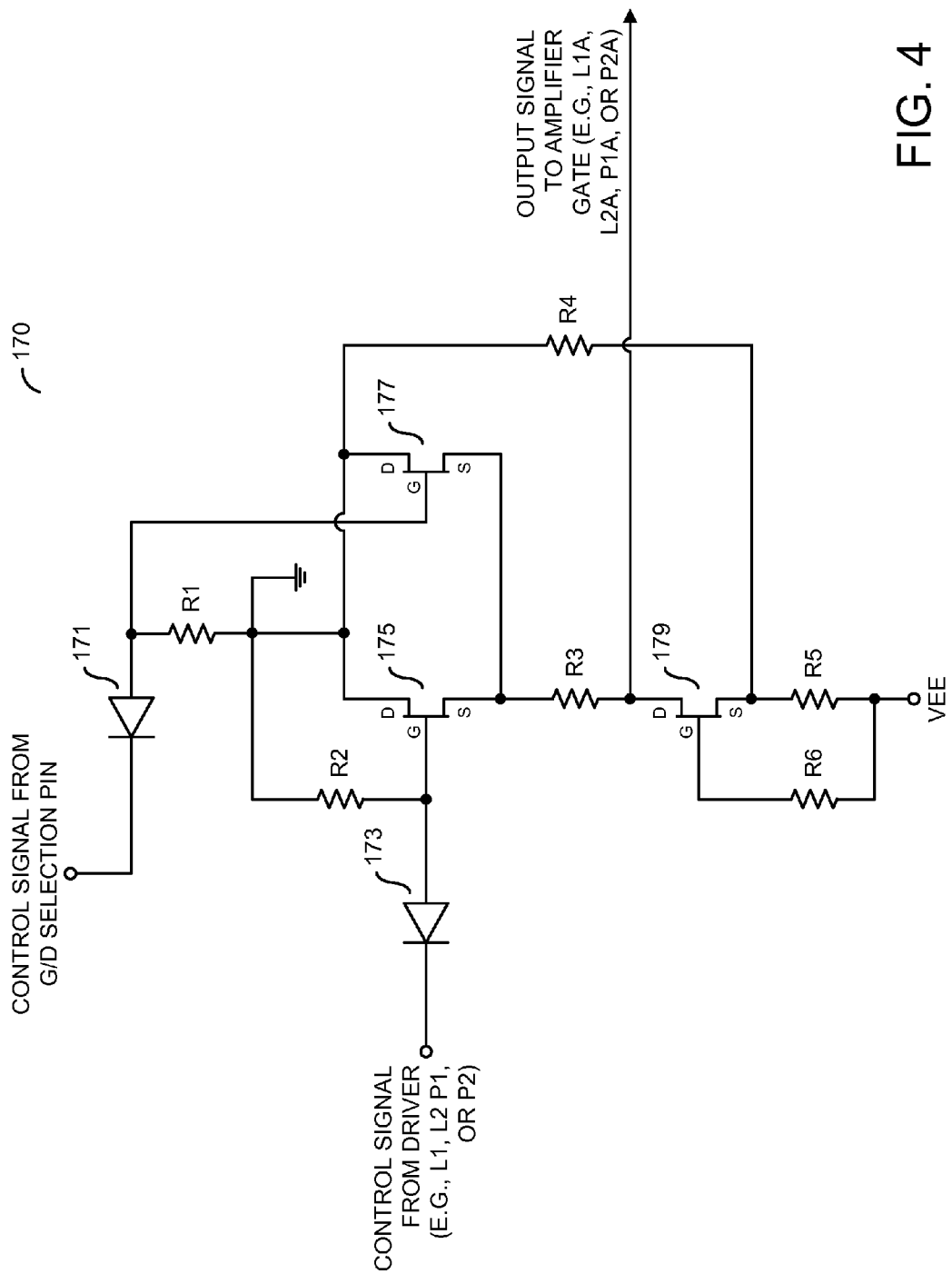
FIG. 4 is a diagram illustrating an example implementation of a gate/drain bias circuit in accordance with an example embodiment of the present invention.

Referring to FIG. 4, a diagram is shown illustrating an example implementation of a gate/drain bias circuit 170 in accordance with an example embodiment of the present invention. The circuit 170 may be used to implement each of the circuits 162-168 of FIG. 3. In one example, the circuit 170 may comprise a number of devices 171-179 and a number of resistors R1-R6. The devices 171-179 may be implemented using pseudomorphic high electron mobility transistors (pHEMTs). In various embodiments, the devices 171 and 173 may be fabricated as drain-source-connected pHEMT diodes. The resistors R1-R6 may be implemented as one or more resistors.

In one example, the signal G/D may be presented to a cathode terminal of the device 171. A cathode of the device 173 may receive one of the signals L1, L2, P1, and P2. An anode terminal of the device 171 may be connected to a first terminal of the resistor R1 and a gate of the device 177. A second terminal of the resistor R1 may be connected to a first terminal of the resistor R2, a drain of the device 175, a drain of the device 177, and a first terminal of the resistor R4. The connection of the second terminal of the resistor R1, the first terminal of the resistor R2, the drain of the device 175, the drain of the device 177, and the first terminal of the resistor R4 may be connected to a power supply ground (e.g., 0V). A second terminal of the resistor R2 is connected to an anode terminal of the device 173 and a gate of the device 175. A source of the device 175 and a source of the device 177 are connected to a first terminal of the resistor R3. A second terminal of the resistor R3 is connected to a drain of the device 179. A second terminal of the resistor R4 connects to a source of the device 179 and a first terminal of the resistor R5. A second terminal of the resistor R5 may be connected to a supply voltage (e.g., VEE). A first terminal of the resistor R6 connects to a gate of the device 179 and a second terminal of the resistor R6 connects to the supply voltage VEE. One of the signals L1A, L2A, P1A, and P2A corresponding to the signal at the cathode of the device 173 is presented at the drain of the device 179.

Figure 5:
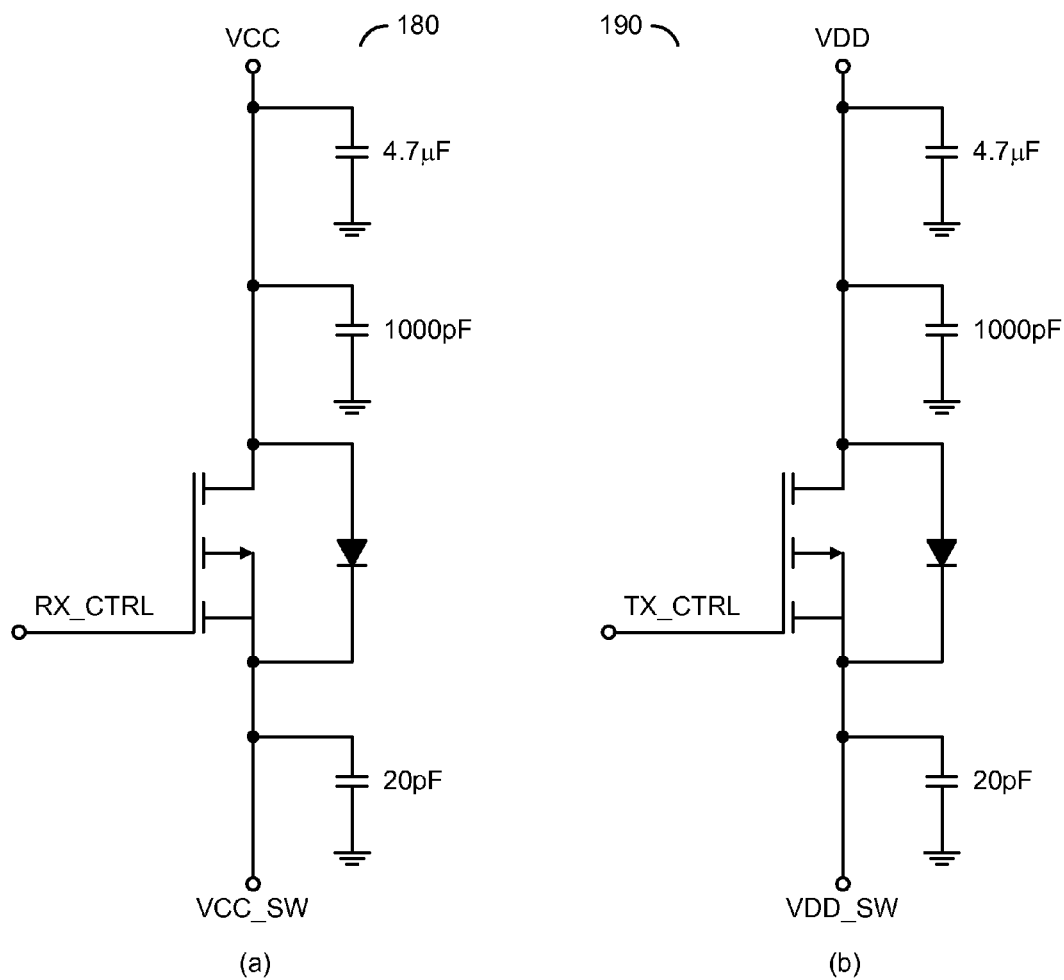
FIG. 5 is a diagram illustrating examples of external drain switching circuits in accordance with an example embodiment of the present invention.

Referring to FIG. 5, diagrams are shown illustrating examples of external drain switching circuits that may be used to implement drain switching with a T/R module in accordance with an example embodiment of the present invention. In various embodiments, separate external drain switching circuits 180 (FIG. 5(a)) and 190 (FIG. 5(b)) may be implemented to enable/disable low-noise amplifiers (LNAs) and power amplifiers (PAs), respectively. When the internal gate switching of the circuit 100 is disabled by the signal G/D, the low-noise amplifiers (LNAs) or power amplifiers (PAs) are enabled, for example, by setting appropriate voltages (e.g., RX_CTRL and TX_CTRL) on gates of P-Channel MOSFETs of the circuits 180 and 190, respectively.

Figure 6:
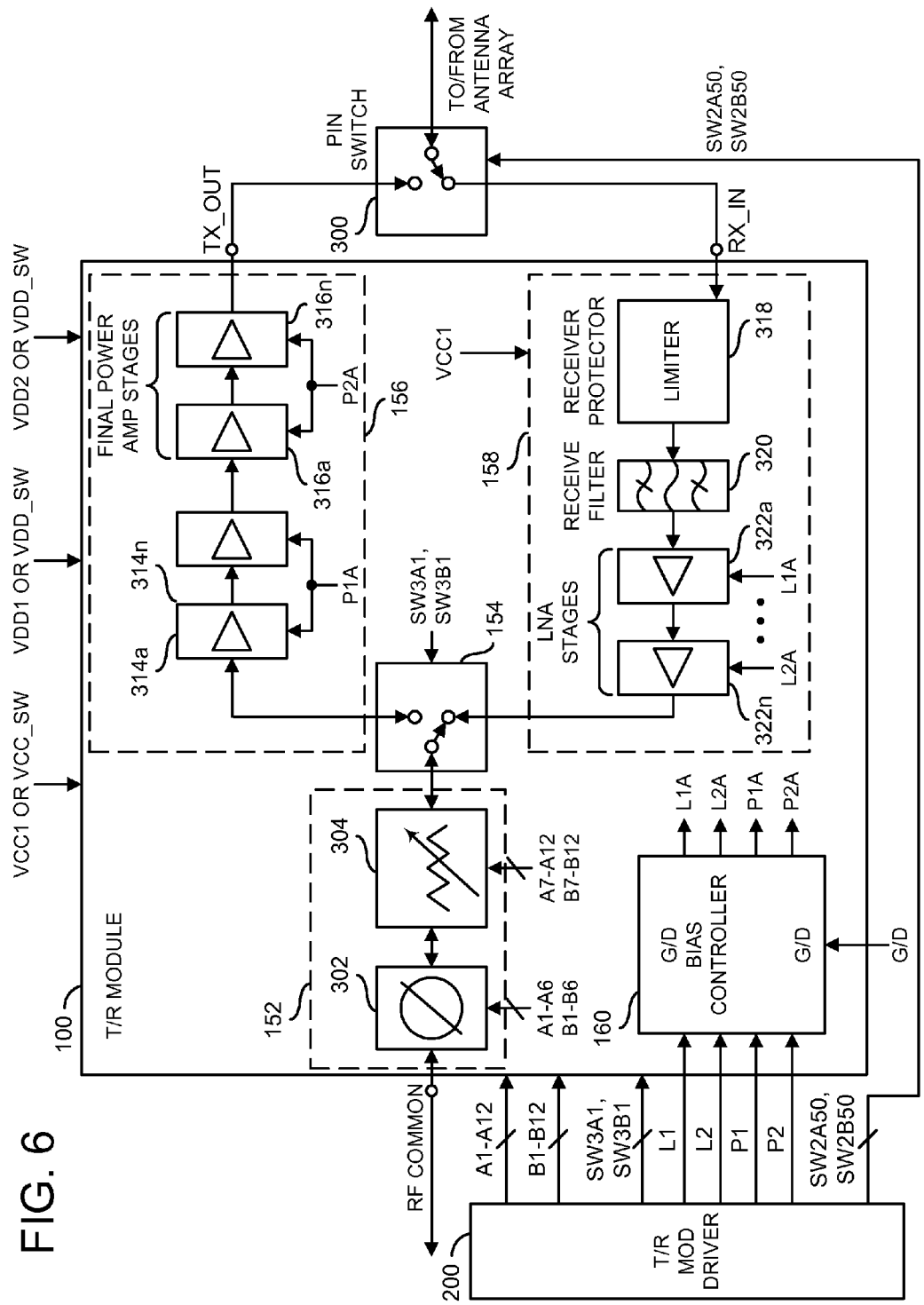
FIG. 6 is a diagram illustrating an example GaAs T/R module in accordance with an embodiment of the present invention implemented in conjunction with a T/R module driver in a radar system.

Referring to FIG. 6, a diagram is shown illustrating a context in which a T/R module in accordance with an embodiment of the present invention is implemented with a monolithic T/R module driver and at least one external PIN diode switch. In one example, the T/R module 100 may be connected with a T/R module driver 200 and a PIN diode switch 300. The PIN diode switch 300 is separate from (external to) the T/R module 100. In one example, the T/R module 100 and PIN diode switch 300 may be part of a radar system. However, other RF transmit/receive systems (e.g., cellular phone system, WiFi, etc.) may be implemented accordingly. The T/R module 100 may have an RF input/output connection (e.g., RF COMMON), a transmit output lead (e.g., TX_OUT), and a receive input lead (e.g., RX_IN). The output lead TX_OUT may be connected to a first terminal of the PIN diode switch 300, the input lead RX_IN may be connected to a second terminal of the PIN diode switch 300, and an antenna or antenna array may be connected to a third terminal of the PIN diode switch 300. A control input of the PIN diode switch 300 may receive a pair of signals SW2A50 and SW2B50 from the T/R module driver 200.

The common leg circuit 152 of the T/R module 100 may comprise a module (or circuit) 302 and a module (or circuit) 304. The transmit chain 156 of the T/R module 100 may comprise a number of modules (or circuits) 314a-314n and a number of modules (or circuits) 316a-316n. The receive chain 158 of the T/R module 100 may comprise a module (or circuit) 318, a module (or circuit) 320, and a number of modules (or circuits) 322a-322n. The module 302 may be implemented as a digital phase shifter. The module 304 may be implemented as a digital attenuator. The modules 314a-314n may implement power amplifier (PA) stages of a transmit path of the T/R module 100. The modules 316a-316n may implement final power amplifier (PA) stages of the transmit path of the T/R module 100. The module 318 may implement a limiter configured to provide protection for a receiver path of the T/R module 100. The module 320 may implement a receive filter. The modules 322a-322n may implement low noise amplifier (LNA) stages of the receive path of the T/R module 100. In some embodiments, a digital attenuator module may be implemented between the LNA stages and share a number of control bits with the module 304.

The T/R module 100 may be configured to receive the signals A1-A12, B1-B12, SW3A1, SW3B1, L1, L2, P1, and P2 from the T/R module driver 200. In one example, the signals SW3A1 and SW3B1 may be used to control the T/R switch module 154 to select between transmit and receive modes of the T/R module 100. The signals SW2A50 and SW2B50 may be used to control the PIN diode switch 300 to select between the transmit and receive modes. Even though a unidirectional arrow is depicted in the T/R switch modules 154 and 300, signals may flow in either direction, as is needed to transmit and receive.

The transmit path of the T/R module 100 generally begins at the RF COMMON terminal. An RF signal is presented to an input of the module 302. The RF signal may be phase shifted by the module 302. In one example, the module 302 may implement a digital phase shifter. For example, the module 302 may be configured to implement a number of bits (e.g., 6) of phase shift (e.g., 5.6° steps). However, other numbers of bits may be implemented accordingly to meet the design criteria of a particular implementation. The amount of phase shift may be determined, in one example, using the signals A1-A6 and B1-B6. The RF signal output by the module 302 is presented to an input of the module 304. The RF signal may be attenuated by the module 304. In one example, the module 304 may implement a variable attenuator. For example, the module 304 may be configured to implement a number of bits (e.g., 6) of attenuation. The amount of attenuation may be determined, in one example, using the signals A7-A12 and B7-B12. However, other numbers of bits may be implemented accordingly to meet the design criteria of a particular implementation. The modules 302 and 304 may implement the same or a different number of bits. For example, fine grained phase shift and attenuation may be employed to make small adjustments to a shape of an RF signal transmitted by an antenna array connected to the T/R module 100.

After the selected amount of phase shift and/or attenuation is applied, the RF signal exits the module 304 and continues to the power amplifier (PA) stages 314a-314n and 316a-316n via the module 154. In one example, the transmit path of the T/R module 100 may have four gain stages. However, other numbers of gain stages (including external stages) may be implemented accordingly to ensure that the transmitted signal has the requisite signal strength. The power amplifier stage 316n outputs the amplified RF signal to the output lead TX-OUT that is connected to the first terminal of the PIN diode switch 300, where the amplified RF signal is routed to an antenna or antenna array connected to the third terminal of the PIN diode switch 300.

The receive path of the T/R module 100 generally begins where the second terminal of the PIN diode switch 300 connects to the input lead RX_IN of the T/R module 100. The receive path continues through the module 318 and the module 320 to the modules 322a-322n. The module 318 generally limits the received RF signal to protect the receiver circuitry. The module 320 generally provides filtering of the received RF signal. The modules 322a-322n generally provide a number of gain stages forming a low noise amplifier (LNA). A low noise amplifier (LNA) is generally used to amplify the RF signal received by the antenna array, to increase the signal strength while minimizing added noise, prior to feeding the RF signal into other circuit components. A LNA is a type of amplifier that is optimized to produce as little noise as possible while still meeting amplification requirements for the signal. An output of the module 322n flows across the T/R switch module 154 to the module 304. The modules 154, 304, and 302 generally perform the same function on the received signals as performed on the transmitted signals. The output of the module 302 then travels to the RF COMMON terminal of the T/R module 100.

In an internal gate switching mode, the signals L1, L2, P1, and/or P2 may be used to reduce power dissipation of the T/R module 100 by disabling (e.g., shutting down) one or more of the power amplifier stages of the transmit path or the low noise amplifier stages of the receive path depending upon whether the T/R module is in the transmit or receive mode. For example, the signal P1 may be used to enable/disable the modules 314a-314n, the signal P2 may be used to enable/disable the modules 316a-316n, the signal L1 may be used to enable/disable a first portion of the modules 322a-322n, and the signal L2 may be used to enable/disable a second portion of the modules 322a-322n. The signals L1 and L2 may be configured to control the operation of the low noise amplifier (LNA) stages 322a-322n in the receive path (via the signals L1A and L2A) to reduce power dissipation during operation of the T/R module 100 in the transmit mode. The signals P1 and P2 may be configured to control operation of the power amplifier (PA) stages 314a-314n and 316a-316n in the transmit path (via the signals P1A and P2A) to reduce power dissipation during operation of the T/R module 100 in the receive mode. Any number of signals Ln and Pm may be implemented to meet the design criteria of a particular implementation, where m and n may be the same or different integers.

In an external drain switching mode, the operations of signals L1, L2, P1, and/or P2 are overridden (ignored) and the signals L1A, L2A, P1A, and P2A are set such that the power amplifier stages of the transmit path and the low noise amplifier stages of the receive path are always enabled (e.g., turned on). Depending upon whether a respective external drain switching circuit is ON or OFF, power is provided to the power amplifier stages of the transmit path and the low noise amplifiers of the receive path via corresponding inputs (e.g., VCC1, VDD1, VDD2) of the T/R module. The external drain switching may provide faster switching than the internal gate switching.

By splitting the power and low noise amplifiers into stages and controlling the stages by separate signals, feedback paths may be eliminated that could lead to instability. For example, there would be a risk of feedback through the L1 control circuit causing oscillations if too many stages are controlled by the same control line. When switching between transmit and receive or receive and transmit modes, a period in an idle state (e.g., both transmit and receive functions disabled) may be provided to prevent potentially catastrophic loop oscillations.

Figure 7:
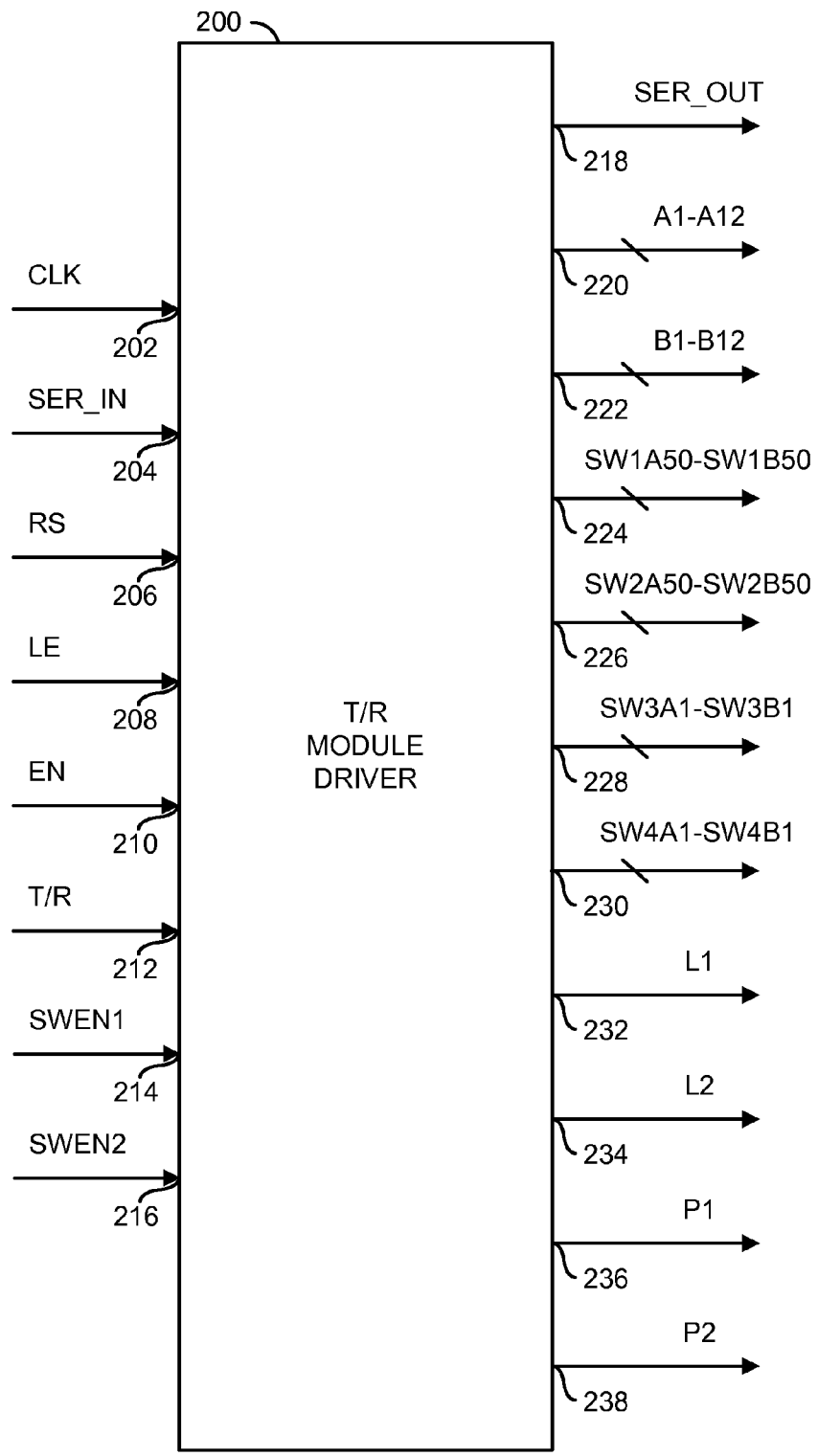
FIG. 7 is a more detailed diagram illustrating the transmit/receive module driver of FIG. 6.

Referring to FIG. 7, a diagram is shown illustrating a circuit 200 in accordance with an embodiment of the present invention. In one example, the circuit 200 may implement a transmit/receive module driver. The circuit 200 may, in one example, be implemented as a dedicated complimentary metal oxide semiconductor (CMOS) driver for use with multifunction modules such as GaAs based transmit/receive (T/R) modules and high current PIN diode switches. The circuit 200 may be implemented on a monolithic integrated circuit (IC). In one example, the circuit 200 may be configured to accept transmit/receive and enable inputs, and translate the transmit/receive and enable inputs to (i) control transmit/receive (T/R) switches in a transmit/receive (T/R) module, (ii) control PIN diode switches attached to a T/R module, and (iii) enable/disable transmit and receive amplifiers either separately or shutting off both transmit and receive amplifiers to provide an idle state and/or a power conservation state. In various embodiments, the amplifier control draws no current when the amplifiers are disabled.

The circuit 200 may include a serial interface. In one example, a 24-bit serial interface may be implemented. However, other numbers of bits may be implemented accordingly to meet the design criteria of a particular implementation. In various embodiments, the serial interface may be configured to drive digital attenuators and/or phase shifters. The circuit 200 may also include functionality to switch between transmit and receive channels and to enable/disable low-noise amplifiers (LNAs) and/or power amplifiers (PAs). In one example, high speed analog CMOS technology may be utilized in implementing the transmit/receive module driver 200 to achieve low power consumption at moderate to high speeds.

In one example, the T/R module driver 200 may include an input 202, an input 204, an input 206, an input 208, an input 210, an input 212, an input 214, an input 216, an output 218, an output 220, an output 222, an output 224, an output 226, an output 228, an output 230, an output 232, an output 234, an output 236, an output 238. The input 202 may receive a clock signal (e.g., CLK). The input 204 may receive a serial data stream (e.g., SER_IN). The input 206 may receive a signal (e.g., R/S). The input 208 may receive a signal (e.g., LE). The input 210 may receive a signal (e.g., EN). The input 212 may receive a signal (e.g., T/R). The input 214 may receive a signal (e.g., SWEN1). The input 216 may receive a signal (e.g., SWEN2). The output 218 may present a serial output data stream (e.g., SER_OUT). The output 220 may present a first set of parallel outputs (e.g., A1-A12). The output 222 may present a second set of parallel outputs (e.g., B1-B12). In one example, the outputs B1-B12 may be complementary to the outputs A1-A12. The output 224 may present a pair of complementary signals (e.g., SW1A50 and SW1B50). The output 226 may present a pair of complementary signals (e.g., SW2A50 and SW21350). The output 228 may present a pair of complementary signals (e.g., SW3A1 and SW3B1). The output 230 may present a pair of complementary signals (e.g., SW4A1 and SW4B1). The outputs 224 and 226 may provide high-current (e.g., 50 mA) outputs. The outputs 228 and 230 may provide low-current (e.g., 1 mA) outputs. The output 232 may present a signal (e.g., L1). The output 234 may present a signal (e.g., L2). The output 236 may present a signal (e.g., P1). The output 238 may present a signal (e.g., P2).

The signal LE may implement a control signal that may be used to latch input data received via the signal SER_IN.

The signal RS may implement a control signal (e.g., a register select signal) that may be used to select between multiple control values supplied via the serial data stream SER_IN. In an example where the signal SER_IN supplies 24-bit serial data containing two 12-bit control values (e.g., C1A-C12A and C1B-C12B), the signal LE may be used to latch the 24-bit data (e.g., into two registers) and the signal RS may be used to select between the two 12-bit control values C1A-C12A and C1B-C12B (e.g., by enabling/disabling register outputs, multiplexing register outputs, etc.). Having multiple sets of control values in the serial data stream SER_IN allows parameters (e.g., attenuation, phase states, etc.) in circuitry attached to the circuit 200 to be quickly changed (e.g., by changing a value (or state) of the signal RS).

The signal EN may implement a control signal that may be used to enable/disable circuitry (e.g., amplifiers) attached to the circuit 200. In one example, the signal EN may be implemented as a single bit that disables all amplifiers when set in a predefined logic state. When used in conjunction with the signal T/R, one or more amplifiers (e.g., transmitter power amplifiers) may be enabled while one or more other amplifiers (e.g., receiver low noise amplifiers) are disabled, and vice versa. The signals SWEN1 and SWEN2 may implement control signals that may be used to select between high-current (e.g., 50 mA) and low-current (e.g., 1 mA) outputs for controlling circuitry attached to the circuit 200. The signal T/R may be implemented as a control signal for switching between a transmit and a receive mode. In one example, the signals EN and T/R may be used to control logic configured to enable/disable low noise amplifiers (LNAs) and power amplifiers (PAs) attached to the circuit 200. In one example, the signals SWEN1, SWEN2, and T/R may be used to control logic configured to select between (activate/inactivate) outputs for driving low-power (e.g., GaAs) T/R switches and outputs for driving high-power (e.g., PIN diode) T/R switches.

In one example, the output signals SW1A50, SW1B50, SW2A50, and SW2B50 may be configured to control PIN diode switches separate from (external to) a monolithic microwave integrated circuit (MMIC) implementing a T/R module, while the outputs SW3A1, SW3B1, SW4A1, and SW4B1 may be configured to control GaAs switches on the MMIC. The signals L1, L2, P1, and P2 may be used, in one example, to control amplifiers in the T/R module being driven by the circuit 200. For example, the signals L1 and L2 may be used to control separate stages of a low noise amplifier (LNA) section. The signals P1 and P2 may be used to control separate stages of a power amplifier (PA) section. In one example, the use of multiple control signals to control multiple amplifier stages may reduce the possibility of instability due to feedback between the amplifier stages. An idle state may be implemented (e.g., to eliminate loop oscillation). The circuit 200 may be configured to pass through an idle state when switching from transmit to receive and/or when switching from receive to transmit modes. During the idle state, the circuit 200 may be configured to disable the separate stages of the low noise amplifier (LNA) and power amplifier (PA) sections while drawing essentially no current.

Figure 8:
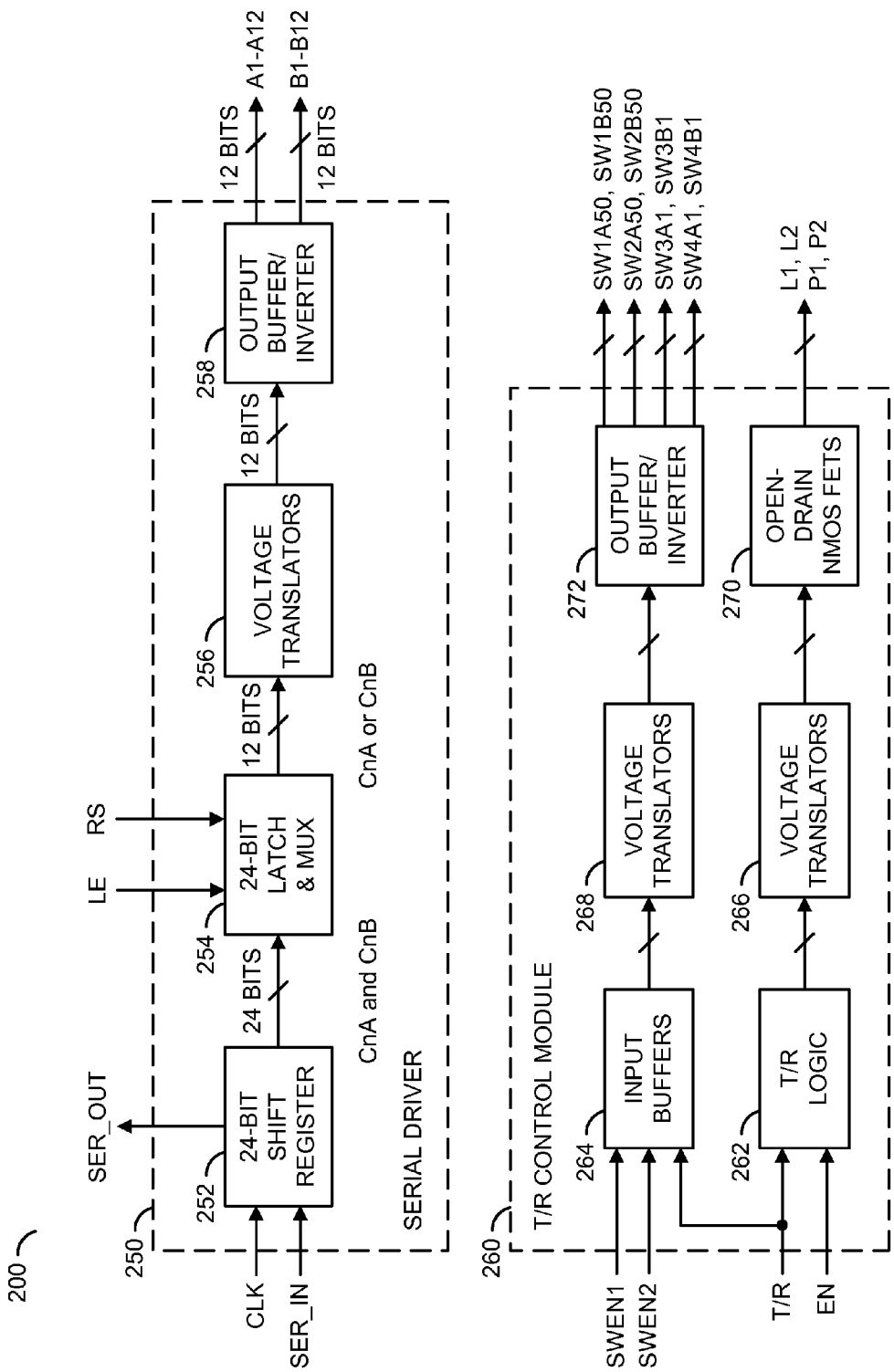
FIG. 8 is a block diagram illustrating an example implementation of the transmit/receive (T/R) module driver of FIG. 7.

Referring to FIG. 8, a block diagram is shown illustrating an example implementation of the circuit 200 of FIG. 7 in accordance with an example embodiment of the present invention. In one example, the circuit 200 may comprise a block 250 and a block 260. The block 250 may implement a serial driver module. The block 260 may implement a T/R control module. The block 250 generally implements a serial control interface using the input 202 (e.g., CLK), the input 204 (e.g., SER_IN), the input 206 (e.g., RS), the input 208 (e.g., LE), and the serial output 218 (e.g., SER_OUT), the output 220 (e.g., the in phase outputs A1-A12), and the output 222 (e.g., the complementary outputs B1-B12). In one example, the serial control interface may be compatible with the SPI protocol.

In one example, when the serial control interface is activated, a serial word (e.g., 24 bits) may be loaded (e.g., MSB first) using the signal CLK. When the serial word has been loaded, the signal LE may be asserted (e.g., set to a logic HIGH, or 1) to latch (store) the data values (e.g., C1A-12A and C1B-C12B) contained in the serial word. When the signal LE is asserted, the signal CLK may be masked to prevent data transition during the data transfer. The signal RS may be set to select a particular control value (e.g., C1A-C12A or C1B-C12B) for presentation on the complementary outputs A1-A12 and B1-B12. The signal SER_OUT generally comprises the signal SER_IN delayed by a number of clock cycles equivalent to the word size implemented (e.g., 24 clock cycles for a 24-bit word).

The T/R control module 260 generally implements a T/R control interface using the input 210 (e.g., the signal EN), the input 212 (e.g., the signal T/R), the input 214 (e.g., the signal SWEN1), the input 216 (e.g., the signal SWEN2), and the outputs 224-238 (e.g., the signals SW1A50, SW1B50, SW2A50, SW2B50, SW3A1, SW3B1, SW4A1, SW4B1, L1, L2, P1, and P2). The output signals SW1A50, SW1B50, SW2A50, and SW2B50 are generally configured to drive high-current (e.g, 50 mA) switches configured to connect a multi-function module to high power RF circuits. For example, the signals SW1A50, SW1B50, SW2A50, and SW2B50 may be used to control single-pole, double-throw (SPDT) PIN diode switches in a radar system in order to switch between transmit and receive modes. The output signals SW3A1, SW3B1, SW4A1, and SW4B1 are generally configured to drive low-current (e.g., 1 mA) switches that are part of a multi-function module. For example, the signals SW3A1, SW3B1, SW4A1, and SW4B1 may be used to control GaAs single-pole, double-throw (SPDT) T/R switches in a T/R module in order to switch between transmit and receive modes.

The T/R control module 260 may be further configured to use a combination of the input signals EN and T/R to implement power consumption control. For example, the T/R control module 260 may control the output signals L1, L2, P1 and P2 based upon the combination of one or more bits of the input signals EN and T/R. The output signals L1, L2, P1 and P2 may then be utilized to turn on/off subsequent circuitry. For example, the signals L1, L2, P1 and P2 may be configured to turn on/off receive path LNAs and transmit path PAs in a T/R module. In one example, the signals L1, L2, P1 and P2 may be implemented with open-drain negative-doped metal oxide semiconductor (NMOS) field effect transistors (FETs). When one of the NMOSFETs is turned on, the NMOSFET may be configured to pull up a gate of a GaAs FET in an amplifier to turn the amplifier on. The biasing of the gate of the GaAs FET may be controlled by a bias circuit that may be implemented separately from (external to) the circuit 200. When the NMOSFETs are turned off, the outputs may provide a high impedance mode in which no current is used. In one example, the signals L1, L2, P1 and P2 may be used to control up to four LNA stages and four PA stages. In one example, the T/R control module 260 may include logic and/or a look-up table (LUT). In another example, the signals L1, L2, P1, and P2 may be implemented using CMOS output buffers (described below in connection with FIG. 10).

In one example, the block 250 may comprise a block (or circuit) 252, a block (or circuit) 254, a block (or circuit) 256, and a block (or circuit) 258. In one example, the block 260 may comprise a block (or circuit) 262, a block (or circuit) 264, a block (or circuit) 266, a block (or circuit) 268, a block (or circuit) 270, and a block (or circuit) 272. The block 252 may be implemented, in one example, as a 24-bit shift register. The block 254 may be implemented, in one example, as a 24-bit input latch and multiplexer circuit. The block 256 may be implemented, in one example, as a voltage translator. The block 258 may be implemented, in one example, as an output buffer/inverter block. The block 262 may be implemented as a control logic. The block 264 may implement an input buffer circuit. The blocks 266 and 268 may implement voltage translators. The block 270 may be implemented, in one example, as a number of open-drain NMOSFETs. The block 272 may implement a number of output buffers/inverters. In some embodiments, the blocks 262 and 264 may be implemented as a single T/R logic block and the blocks 266 and 268 may be implemented as a single voltage translator block.

The block 252 may have a first input that may receive the signal CLK, a second input that may receive the signal SER_IN, a first output that may present the signal SER_OUT, and a second output that may present a number of parallel signals (e.g., CnA and CnB, where n represents the number of bits) to a first input of the block 254. The block 254 may have a second input that may receive the signal LE, a third input that may receive the signal RS, and an output that may present a number of bits to an input of the block 256. In one example, the block 254 may be configured to latch (store) the values of the parallel signals (e.g., CnA and CnB) in response to the signal LE being asserted. Depending on the value (state) of the signal RS, the output of the block 254 presents the bits of a predefined portion of the latched parallel signals (e.g., either the signal CnA or the signal CnB in the current example). The block 256 may have an output that may present a number of signals to an input of the block 258. The block 258 may have a number of first outputs that may present the signals A1-A12 and a number of second outputs that may present the signals B1-B12.

The block 262 may have a first input that may receive the signal EN and a second input that may receive the signal T/R. The block 264 may have a first input that may receive the signal T/R, a second input that may receive the signal SWEN1, and a third input that may receive the signal SWEN2. An output of the block 262 may present a number of signals to an input of the block 266. An output of the block 264 may present a number of signals to an input of the block 268. In one example, the blocks 262 and 264 may implement logic and/or a look-up table (LUT) configured to determine output values in response to the input signals. The block 266 may have an output that may present a number of signals to an input of the block 270. The block 268 may have an output that may present a number of signals to an input of the block 272. The block 270 may have a number of outputs that may present the signals L1, L2, P1 and P2. The block 272 may have a number of outputs that may present the signals SW1A50, SW1B50, SW2A50, SW2B50, SW3A1, SW3B1, SW4A1, and SW4B1.

Figure 9:
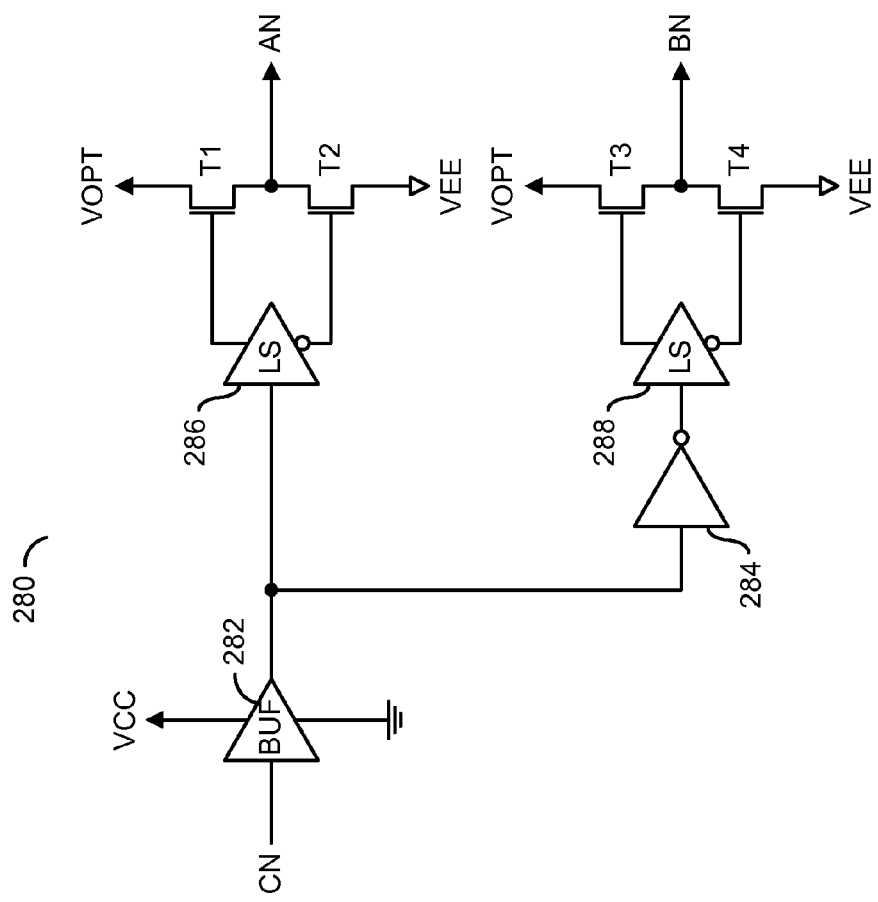
FIG. 9 is a diagram illustrating a functional schematic for one bit of a serial driver circuit of FIG. 8.

Referring to FIG. 9, a diagram of a circuit 280 is shown illustrating a 1-bit path of the serial driver circuit 250 of FIG. 2. The circuit 280 generally represents a function schematic of a pathway by which the serial driver circuit 250 of FIG. 2 generates each of the signals A1-A12 and B1-B12 in response to signals C1A-C12A or C1B-C12B. The circuit 280 generally comprises a block (or circuit) 282, a block (or circuit) 284, a block (or circuit) 286, a block (or circuit) 288, and a number of transistors T1-T4. The block 282 generally represents CMOS (complimentary metal oxide semiconductor) circuitry that may, in one example, be used to implement the blocks 252 and 254. The block 284 generally represents an inverter function that may be used to generate a complement of a signal. In one example, the blocks 282 and 284 may be combined as a combination of inverting and non-inverting input buffers. The blocks 286 and 288 generally represent the voltage translator (or level shifting) module 256 of the serial driver circuit 250. The transistors T1-T4 generally represent the output buffer/inverter block 258 of the serial driver circuit 250.

In an example operation, an input signal (e.g., CN) is presented to an input of the input buffer portion of the block 282. The block 282 generates an output that is presented to an input of the block 284 and an input of the block 286. The block 284 generally inverts (complements) the received signal and presents the complemented signal to an input of the block 288. The blocks 286 and 288 generally shift the received signals to a voltage level appropriate for driving the pairs of transistors T1 and T2, and T3 and T4, respectively. The transistors T1 and T2 are generally configured to generate an output signal (e.g., AN) in response to a first supply voltage (e.g., VOPT) and a second supply voltage (e.g., VEE). The transistors T3 and T4 are configured to generate an output signal (e.g., BN) in response to the power supplies VOPT and VEE. In some embodiments, the supply voltage VOPT may be implemented as ground (e.g., GND). Other supply voltages may be implemented accordingly to meet the design criteria of a particular implementation. The output signal AN generally tracks the input signal CN. The output BN is generally a complement of the input signal CN. Multiple instances of the circuit 280 may be implemented to generate the signals A1-A12 and B1-B12 shown in FIG. 2.

As illustrated by the circuit 280, the serial driver circuit 250 is generally configured to translate logic level (e.g., TTL, CMOS, LVCMOS, etc.) control inputs into negative gate control voltages appropriate for gallium arsenide (GaAs) FET microwave switches, phase shifters, and attenuators. In one example, the serial driver circuit 250 may be implemented using high speed analog CMOS technology to achieve low power dissipation at moderate to high speeds. The serial driver circuit 250 may be implemented to encompass most microwave switching applications. In some embodiments, the signals A1-A12 and B1-B12 may be implemented with an output HIGH level in the range of 0-2 volts relative to ground (GND). The range of 0-2 volts relative to ground may optimize the intermodulation products of GaAs FET control devices at low frequencies.

Figure 10:
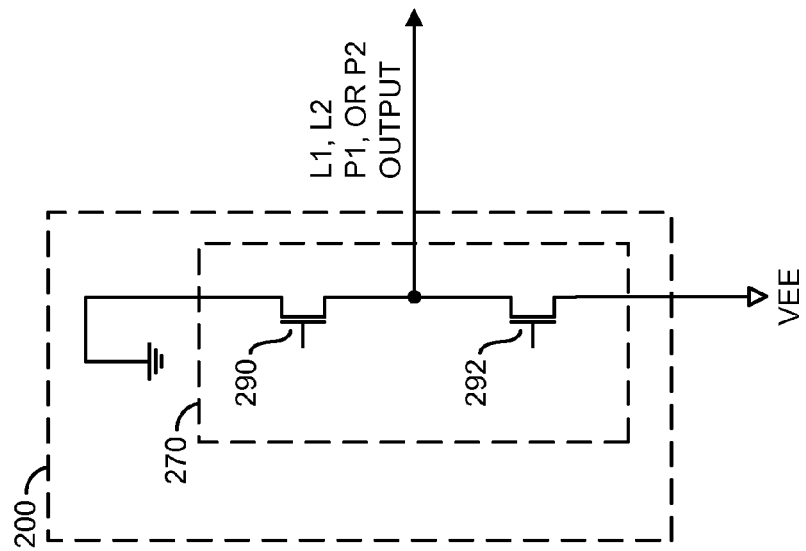
FIG. 10 is a diagram illustrating an example output circuit of the T/R module driver of FIG. 8 for controlling a T/R amplifier.

Referring to FIG. 10, a diagram is shown illustrating an example of a control output for controlling an amplifier of the T/R module utilizing one of the outputs of the T/R control module 260 of FIG. 8. A PMOSFET 290 and an NMOSFET 292 of the module 270 generally provide the signals L1, L2, P1 and P2 presented at the outputs 232-238 of the T/R module driver 200. The transistors 290 and 292 form a push-pull output buffer which switches between a supply ground (e.g., GND) and the supply voltage VEE in order to enable/disable the amplifiers of an attached T/R module.

Figure 11:
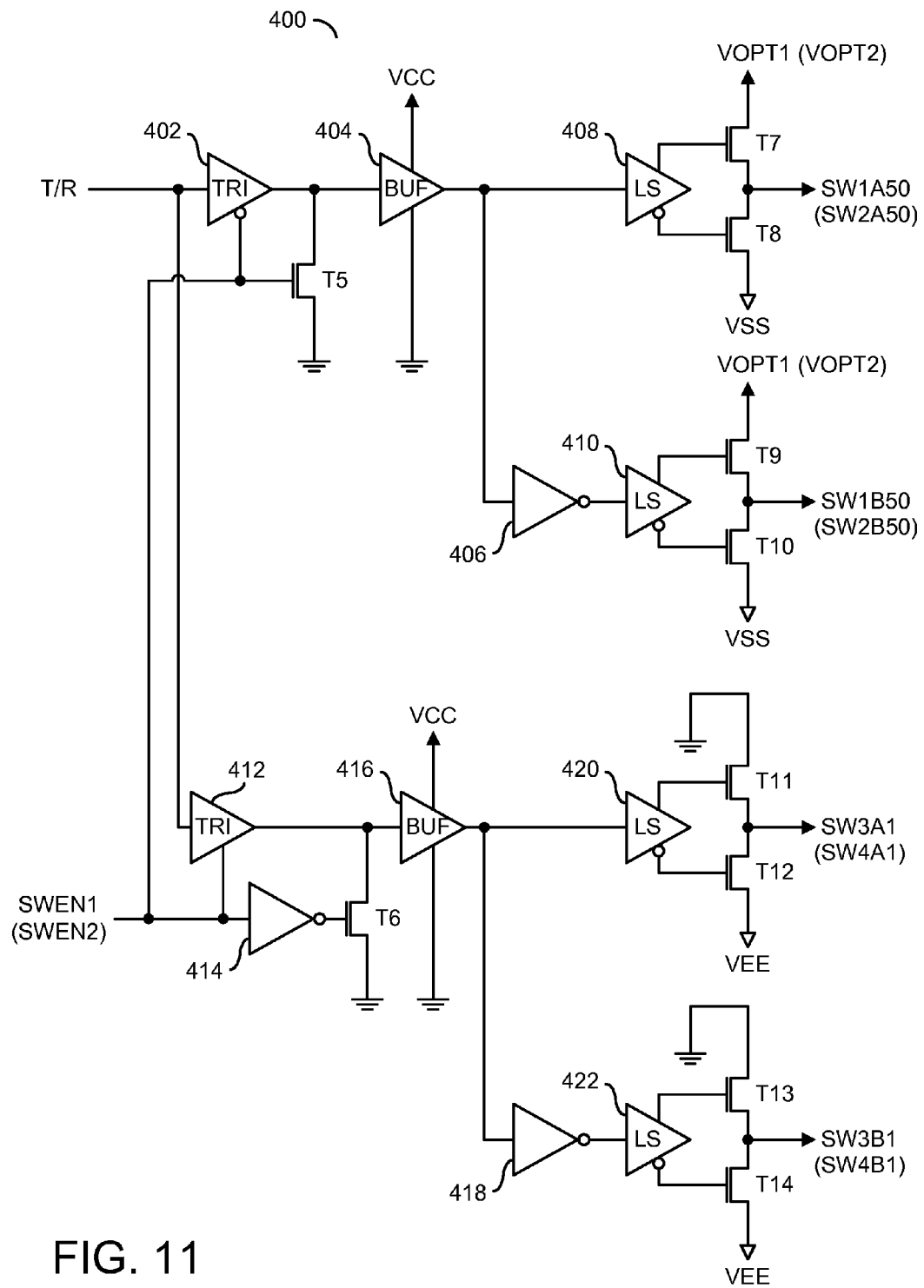
FIG. 11 is a diagram illustrating a functional schematic for one bit of a T/R control circuit of FIG. 8.

Referring to FIG. 11, a diagram of a circuit 400 is shown illustrating a pair of buffer outputs of the T/R control circuit 260 of FIG. 8. The circuit 400 generally represents a function schematic of a pathway by which the T/R control circuit 260 of FIG. 8 generates the signals SW1A50, SW1B50, SW3A1, and SW3B1 in response to the signals SWEN1 and T/R. The signals SW2A50, SW2B50, SW4A1, and SW4B1 are generated in response to the signals SWEN2 and T/R using a similar circuit (as shown in parentheses). The circuit 400 generally comprises a block (or circuit) 402, a block (or circuit) 404, a block (or circuit) 406, a block (or circuit) 408, a block (or circuit) 410, a block (or circuit) 412, a block (or circuit) 414, a block (or circuit) 416, a block (or circuit) 418, a block (or circuit) 420, a block (or circuit) 422, and a number of transistors T5-T14. The blocks 402-406 and 412-418 generally represent CMOS input buffer circuitry that may, in one example, be used to implement the block 264. The blocks 406, 414 and 418 generally represents an inverter function that may be used to generate a complement of a signal. In one example, the blocks 404, 406, 416, and 418 may be combined as a combination of inverting and non-inverting input buffers. The blocks 408, 410, 420, and 422 generally represent the voltage translator module 268 of the T/R control circuit 260. The transistors T7-T14 generally represent the output buffer/inverter block 272 of the T/R control circuit 260.

In one example, the block 402 is implemented as an active-low three-state input buffer and the block 412 is implemented as an active-high three-state input buffer. In an example operation, the signal T/R is presented to an input of the block 402 and an input of the block 412. The signal SWEN1 is presented to a control input of the block 402, a control input of the block 412, a gate terminal of the transistor T5, and an input of the block 414. The block 402 generates an output that is presented to an input of the block 404. The drain/source of the transistor T5 is connected between the input of the block 404 and ground. An output of the block 414 is presented to a gate terminal of the transistor T6. The block 412 generates an output that is presented to an input of the block 416. The drain/source of the transistor T6 is connected between the input of the block 416 and ground.

The block 404 generates an output that is presented to an input of the block 406 and an input of the block 408. The block 406 generally inverts (complements) the received signal and presents the complemented signal to an input of the block 410. The blocks 408 and 410 generally shift the received signals to a voltage level appropriate for driving the complementary pairs of transistors T7 and T8, and T9 and T10, respectively. The transistors T7 and T8 are generally configured to generate the output signal SW1A50 in response to a respective supply voltage (e.g., VOPT1) and the supply voltage VSS. The transistors T9 and T10 are configured to generate the output signal SW1350 in response to the power supplies VOPT1 and VSS.

The block 416 generates an output that is presented to an input of the block 418 and an input of the block 420. The block 418 generally inverts (complements) the received signal and presents the complemented signal to an input of the block 422. The blocks 420 and 422 generally shift the received signals to a voltage level appropriate for driving the complementary pairs of transistors T11 and T12, and T13 and T14, respectively. The transistors T11 and T12 are generally configured to generate the output signal SW3A1 in response to the ground potential GND and a supply voltage VEE. The transistors T13 and T14 are configured to generate the output signal SW3B1 in response to the ground potential and the supply voltage VEE. The transistors T7-T10 are generally implemented larger and with higher voltage ratings than the transistors T11-T14. Other supply voltages may be implemented accordingly to meet the design criteria of a particular implementation.

As illustrated by the circuit 400, the T/R control circuit 260 is generally configured to translate logic level (e.g., TTL, CMOS, LVCMOS, etc.) control inputs into negative gate control voltages appropriate for gallium arsenide (GaAs) FET microwave switches and PIN diode switches. In one example, the T/R control circuit 160 may be implemented using high speed analog CMOS technology to achieve low power dissipation at moderate to high speeds. The T/R control circuit 260 may be implemented to encompass most microwave switching applications. In some embodiments, the signals SW3A1, SW3B1, SW4A1, and SW4B1 may be implemented with an output HIGH level in the range of 0-2 volts relative to ground (GND). The range of 0-2 volts relative to ground may optimize the intermodulation products of GaAs FET control devices at low frequencies.

For driving higher power devices (e.g., PIN diode circuits), the outputs SW1A50, SW1B50, SW2A50, and SW2B50 may be switched between +5 and −5 volts, or switched between +5 and −10 volts. The voltage range implemented may be selected to meet the design criteria of a particular application. The actual driver output voltages may be lower when driving large currents due to resistance of the output devices (e.g., represented by the transistors T7-T14). In one example, the transistors T11-T14 may be tied to the supply voltages set between 1.0 and 2.0 volts relative to ground (GND) to improve the intermodulation performance and the 1 dB compression point of GaAs control devices at low frequencies.

Referring to FIG. 12, a truth table, TABLE 1, is shown illustrating an example operation of the circuit 160 of FIG. 8 when configured as shown in FIGS. 9-11.

Figure 13:
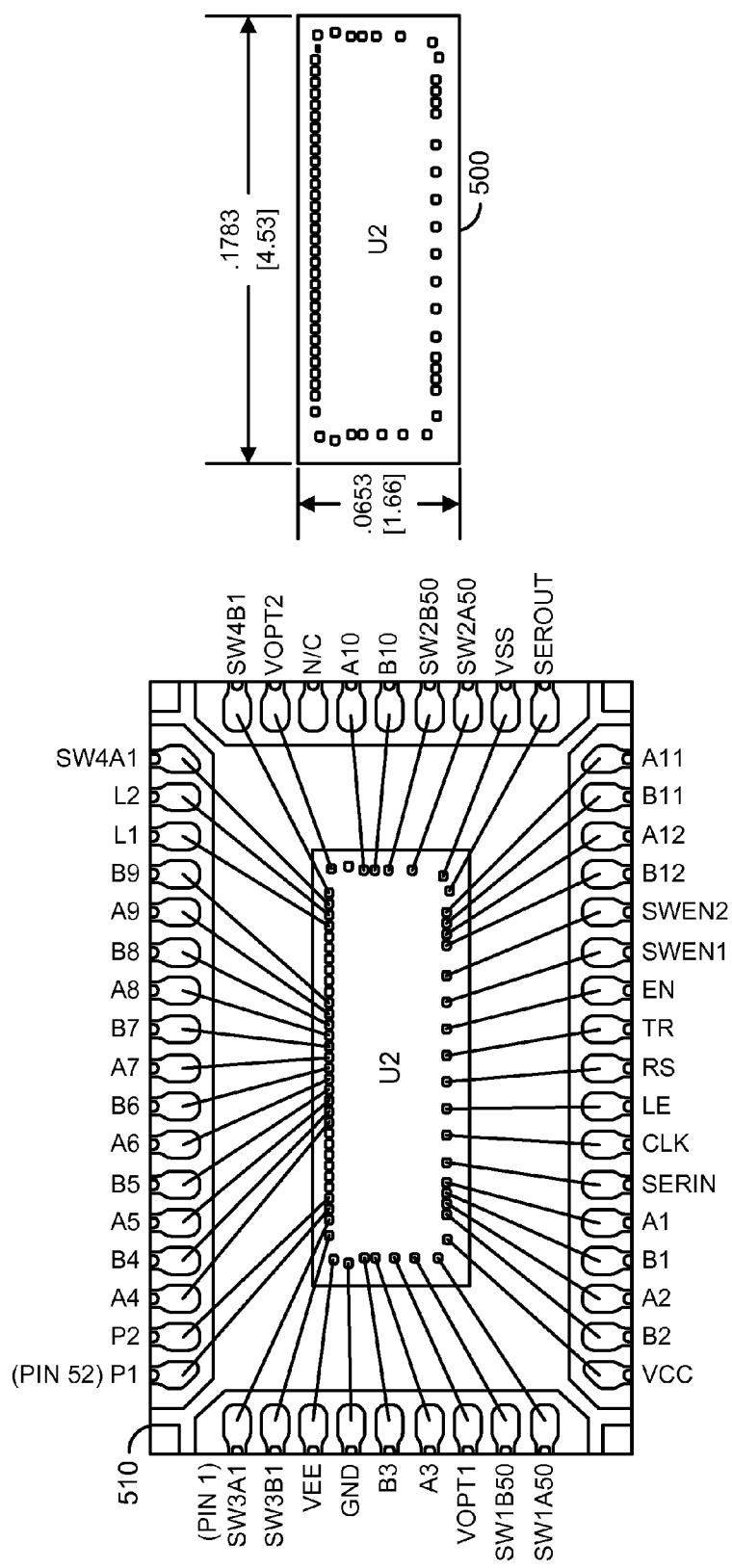
FIG. 13 is a diagram illustrating a package in which an integrated circuit implementing the T/R module driver of FIG. 8 may be mounted.

Referring to FIG. 13, a diagram is shown illustrating an integrated circuit implementing a T/R module driver in accordance with an embodiment of the present invention and a package in which the integrated circuit may be mounted. In one example, the T/R module driver 200 may be implemented as a monolithic integrated circuit (U1) 500. In one example, the monolithic integrated circuit 500 may be packaged in a 5×8 mm PQFN-52LD package 510.

Figure 14:
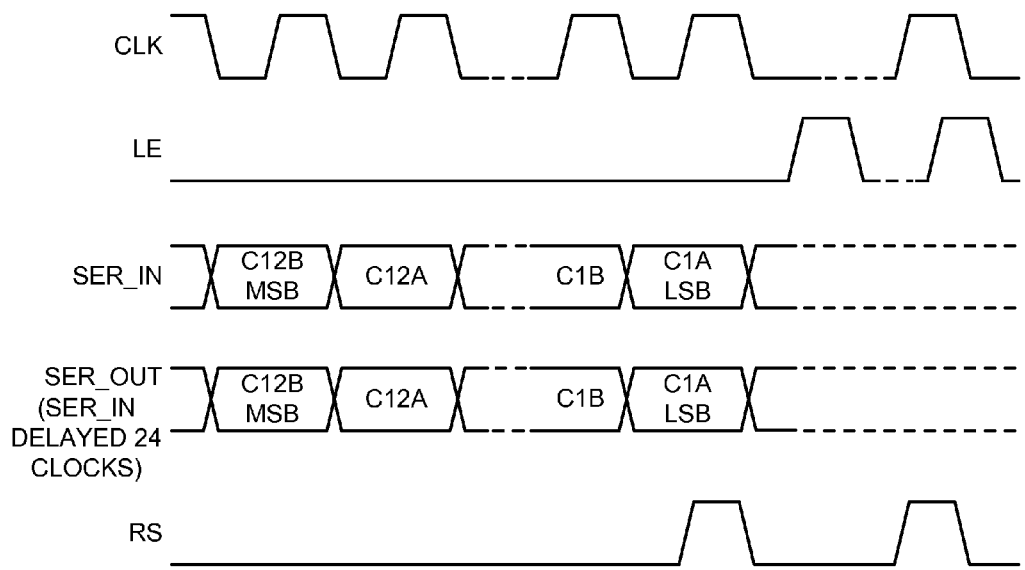
FIG. 14 is a timing diagram illustrating an example operation of a serial interface of the T/R module driver of FIG. 8.

Referring to FIG. 14, a timing diagram is shown illustrating operation of a serial interface of the T/R module driver 200 of FIG. 8. In one example, a serial word (e.g., 24 bits) may be loaded (e.g., MSB first) using the signal CLK. For example, data bits contained in the signal SER_IN may be sampled on a rising edge of the signal CLK. When the serial word has been loaded, the signal LE may be asserted (e.g., set to a logic HIGH, or 1) to latch (transfer) the data for presentation on the complementary outputs A1-A12 and B1-B12. When the signal LE is asserted, the signal CLK may be masked to prevent data transition during the data transfer. The signal SER_OUT generally comprises the signal SER_IN delayed by a number of clock cycles equivalent to the word size implemented (e.g., 24 clock cycles for a 24-bit word).

Figure 15:
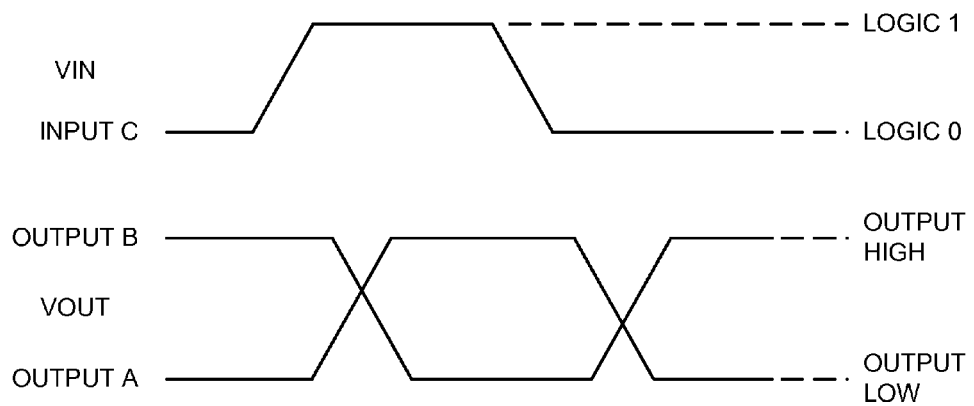
FIG. 15 is a timing diagram illustrating example switching waveforms between an input interface and an output interface of the T/R module driver of FIG. 8.

Referring to FIG. 15, a timing diagram is shown illustrating timing relationships between the latched input signals (e.g., C1A-C12A and C1B-C12B) and the parallel output signals (e.g., A1-A12 and B1-B12) of the circuit 200 of FIG. 8. In one example, the logic levels of latched input signals C1A-C12A and C1B-C12B may be altered in response to the signal LE. The output signals A1-A12 and B1-B12 may be configured to swing between a high output voltage level and a low output voltage level. The particular level of each signal A1-A12 and B1-B12 is determined by the latched input signals selected by the signal RS. The output signals are generally switched between voltage levels other than the levels of the input signals. For example, the output signals A1-A12 and B1-B12 may switch between GND as the high output voltage level and VEE as the low output voltage level. However, other voltage levels may be implemented accordingly to meet the design criteria of a particular implementation.

Figure 16:
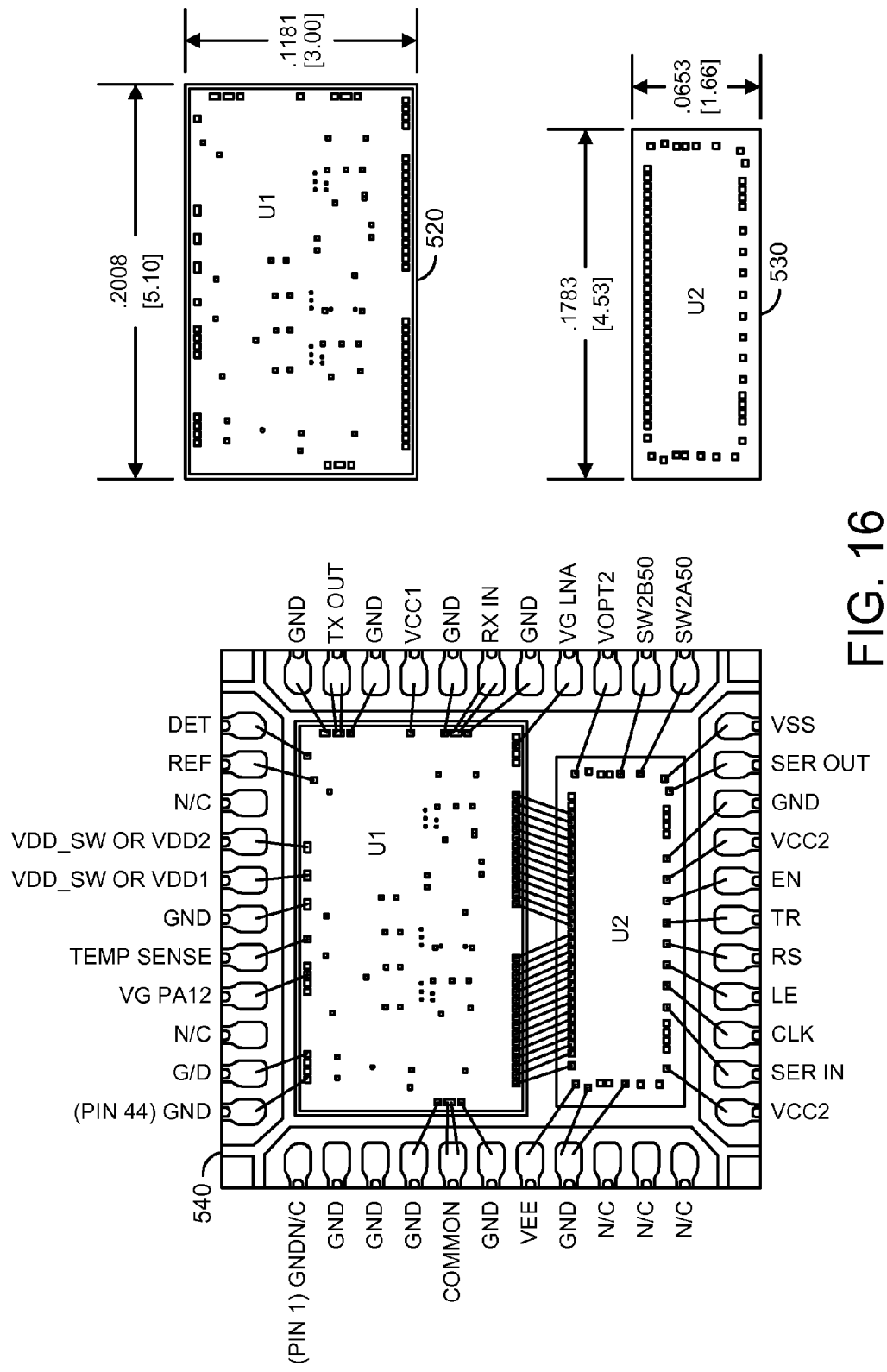
FIG. 16 is a diagram illustrating a multi-chip module package in which integrated circuits implementing a T/R module in accordance with an embodiment of the present invention and a T/R module driver may be mounted.

Referring to FIG. 16, a diagram is shown illustrating a multi-chip module (package) in which an integrated circuit implementing a T/R module in accordance with an embodiment of the present invention and an integrated circuit implementing T/R module driver may be mounted. In one example, the T/R module 100 may be implemented as a monolithic integrated circuit (U1) 520 and the T/R module driver 200 may be implemented as a monolithic integrated circuit (U2) 530. In one example, the monolithic integrated circuits 520 and 530 may be packaged in a 7 mm PQFN-44LD package 540.

Embodiments of the present invention may be used to implement transmit/receive (T/R) modules that allow a user to select between internal gate switching and external drain switching to control the power to various sub-modules (e.g., amplifiers, etc.) of the transmit/receive systems. Switching between the internal gate switching mode and the external drain switching mode may be accomplished using a single control signal.

As used herein, the term "simultaneously" is meant to describe events that share some common time period but the term is not meant to be limited to events that begin at the same point in time, end at the same point in time, or have the same duration. The various signals presented by embodiments of the present invention are generally "on" (e.g., a digital HIGH, or 1) or "off" (e.g., a digital LOW, or 0). However, the particular polarities of the on (e.g., asserted) and off (e.g., de-asserted) states of the signals may be adjusted (e.g., reversed) to meet the design criteria of a particular implementation. Additionally, inverters may be added to change a particular polarity of the signals.

While the invention has been particularly shown and described with reference to the preferred embodiments thereof, it will be understood by those skilled in the art that various changes in form and details may be made without departing from the scope of the invention.

The invention claimed is:

1. An integrated circuit comprising:
   a transmit/receive (T/R) circuit configured to transmit and receive radio frequency (RF) signals; and
   a gate/drain bias control circuit configured to enable or disable internal gate switching of one or more amplifiers of said transmit/receive (T/R) circuit in response to a first control signal, wherein (i) when said first control signal is in a first state, one or more power amplifiers in a transmit path of said transmit/receive (T/R) circuit and one or more low noise amplifiers in a receive path of said transmit/receive (T/R) circuit are switched using internal gate switching and (ii) when said first control signal is in a second state, said internal gate switching is disabled to allow said one or more power amplifiers in said transmit path of said transmit/receive (T/R) circuit and said one or more low noise amplifiers in said receive path of said transmit/receive (T/R) circuit to be enabled and disabled solely by external drain switching.

2. The integrated circuit according to claim 1, wherein said transmit/receive (T/R) circuit comprises:
   a common leg RF circuit;
   a RF receive chain comprising said one or more low noise amplifiers (LNAs);
   a RF transmit chain comprising said one or more power amplifiers (PAs); and
   a transmit and receive switch selectively coupling said common leg circuit with said RF receive chain and said RF transmit chain.

3. The integrated circuit according to claim 1, wherein said transmit/receive (T/R) circuit and said gate/drain bias control circuit are encapsulated in a multi-chip module.

4. The integrated circuit according to claim 3, wherein said multi-chip module further encapsulates a driver circuit configured to control transmit and receive operations of said transmit/receive (T/R) circuit.

5. The integrated circuit according to claim 4, wherein said driver circuit is configured to switch said transmit/receive (T/R) circuit between a transmit mode, a receive mode, and an idle mode.

6. The integrated circuit according to claim 1, wherein said gate/drain bias control circuit is further configured to generate one or more amplifier control signals in response to said first control signal and one or more second control signals.

7. The integrated circuit according to claim 6, wherein said gate/drain bias control circuit is further configured to:
   set said one or more amplifier control signals to a predetermined state when said first control signal is in said second state; and
   generate said one or more amplifier control signals in response to said one or more second control signals when said first control signal is in said first state.

8. The integrated circuit according to claim 6, wherein said gate/drain bias control circuit further comprises a plurality of gate/drain bias circuits, each gate/drain bias circuit configured to generate a respective amplifier control signal in response to said first control signal and a respective second control signal.

9. The integrated circuit according to claim 1, wherein said integrated circuit is part of at least one of a radar system and a radio frequency (RF) transmit/receive system.

10. A method of switching a transmit/receive module comprising the steps of:
   receiving a first control signal;
   when said first control signal is in a first state, switching one or more power amplifiers in a transmit path and one or more low noise amplifiers in a receive path using internal gate switching; and
   when said first control signal is in a second state, disabling said internal gate switching to allow said one or more power amplifiers in said transmit path and said one or more low noise amplifiers in said receive path to be enabled and disabled solely by external drain switching.

11. The method according to claim 10, wherein said amplifiers are switched between a transmit mode, a receive mode, and an idle mode.

12. The method according to claim 10, further comprising generating one or more amplifier control signals in response to said first control signal and one or more second control signals.

13. The method according to claim 12, further comprising:
   generating said one or more amplifier control signals in response to said one or more second control signals when said first control signal is in said first state; and setting said one or more amplifier control signals to a predetermined state when said first control signal is in said second state.

14. The method according to claim 12, further comprising generating a respective amplifier control signal in response to said first control signal and a respective second control signal.

15. The method according to claim 10, further comprising:
selectively connecting said transmit path or said receive path to at least one of an antenna and an antenna array in response to a third control signal.

16. The method according to claim 15, wherein said antenna or said antenna array is part of at least one of a radar system and a radio frequency (RF) transmit/receive system.

17. The method according to claim 10, further comprising:
setting said first control signal in said second state;
switching on one or more power supplies to said one or more power amplifiers in said transmit path and switching off one or more power supplies to said one or more low noise amplifiers in said receive path in a transmit mode;
switching off said one or more power supplies to said one or more power amplifiers in said transmit path and switching on said one or more power supplies to said one or more low noise amplifiers in said receive path in a receive mode; and
switching off one or more power supplies to said one or more power amplifiers in said transmit path and switching off said one or more power supplies to said one or more low noise amplifiers in said receive path in an idle mode.

18. The integrated circuit according to claim 5, wherein:
when said transmit/receive (T/R) circuit is in said transmit mode, one or more power supplies to said one or more power amplifiers in said transmit path are switched on and one or more power supplies to said one or more low noise amplifiers in said receive path are switched off;
when said transmit/receive (T/R) circuit is in said receive mode, said one or more power supplies to said one or more power amplifiers in said transmit path are switched off and said one or more power supplies to said one or more low noise amplifiers in said receive path are switched on; and
when said transmit/receive (T/R) circuit is in said idle mode, said one or more power supplies to said one or more power amplifiers in said transmit path are switched off and said one or more power supplies to said one or more low noise amplifiers in said receive path are switched off.

19. A method of switching a transmit/receive module comprising:
disabling internal gate switching to allow one or more power amplifiers in a transmit path and one or more low noise amplifiers in a receive path to be enabled and disabled solely by external drain switching;
switching on one or more power supplies to said one or more power amplifiers in said transmit path and switching off one or more power supplies to said one or more low noise amplifiers in said receive path in a transmit mode;
switching off said one or more power supplies to said one or more power amplifiers in said transmit path and switching on said one or more power supplies to said one or more low noise amplifiers in said receive path in a receive mode; and
switching off one or more power supplies to said one or more power amplifiers in said transmit path and switching off said one or more power supplies to said one or more low noise amplifiers in said receive path in an idle mode.

20. The method according to claim 19, further comprising:
connecting said transmit path to at least one of an antenna and an antenna array in said transmit mode; and
connecting said receive path to said at least one of said antenna and said antenna array in said receive mode.

* * * * *